United States Patent
Chehadi et al.

[11] Patent Number: 6,125,063
[45] Date of Patent: Sep. 26, 2000

[54] INTEGRATED CIRCUIT WITH MEMORY COMPRISING AN INTERNAL CIRCUIT FOR THE GENERATION OF A PROGRAMMING HIGH VOLTAGE

[75] Inventors: Mohamad Chehadi, Rue des Cuques; David Naura, Batiment, both of France

[73] Assignee: STMicroelectronics S.A., Gentilly, France

[21] Appl. No.: 09/154,268

[22] Filed: Sep. 16, 1998

[30] Foreign Application Priority Data

Oct. 15, 1997 [FR] France .................................. 97 12871

[51] Int. Cl.[7] ..................................................... G11C 7/00
[52] U.S. Cl. .................................. 365/189.11; 365/189.09
[58] Field of Search ........................... 365/189.11, 189.09

[56] References Cited

U.S. PATENT DOCUMENTS

| | | |
|---|---|---|
| 5,109,257 | 4/1992 | Kondo . |
| 5,363,335 | 11/1994 | Jungroth et al. . |
| 5,379,260 | 1/1995 | McClure . |
| 5,544,105 | 8/1996 | Hirose et al. ....................... 365/189.11 |
| 5,544,123 | 8/1996 | Hoshi et al. . |

OTHER PUBLICATIONS

Raul Cemea et al., "TA 7.4: A 34Mb 3.3V Serial Flash EEPROM For Solid–State Disk Applications," IEEE International Solid State Circuits Conference, vol. 38, Feb. 1, 1995, pp. 126–127.

*Primary Examiner*—David Nelms
*Assistant Examiner*—M. Tran
*Attorney, Agent, or Firm*—Theodore E. Galanthay; Allen, Dyer, Doppelt, Milbrath & Gilchrist, P.A.

[57] ABSTRACT

In a memory integrated circuit comprising an internal circuit for the generation of a programming high voltage and comprising a first pad designed to receive a main logic supply voltage below five volts, a second specific supply pad is designed to supply the high voltage generation circuit. This enables the application of a specific logic supply voltage with a voltage level greater than that of the main logic supply voltage in test mode or in application mode.

38 Claims, 2 Drawing Sheets

INTEGRATED CIRCUIT WITH MEMORY COMPRISING AN INTERNAL CIRCUIT FOR THE GENERATION OF A PROGRAMMING HIGH VOLTAGE

BACKGROUND OF THE INVENTION

The present invention relates to integrated circuits, and, more particularly, to an integrated circuit with memory and comprising an internal high voltage generation circuit for the programming and/or erasure of cells of the memory.

BACKGROUND OF THE INVENTION

The development of technology is leading to the reduction of the logic supply voltage applied to internal circuits so as to achieve a constantly greater reduction in energy consumption. It is thus possible in the market today, to find logic circuits supplied with 3 volts. It is being attempted to bring this value down to 1 volt. However, this low level of logic supply is not without consequences for the performance characteristics of certain circuits.

In particular, certain memory integrated circuits such as, in particular, EEPROM type memory integrated circuits have an internal programming high voltage generation circuit. This programming high voltage generation circuit is particularly sensitive to the level of the logic supply voltage that it receives at its input. On the one hand, the level of the logic supply voltage affects the programming high voltage generated at its output. With a lower logic supply voltage, the level of the programming high voltage generated is lower. This is a source of difficulty for the programming or erasure of the memory cell.

Indeed, with a lower level of this programming high voltage (for example Vpp=9 volts with a logic supply Vcc=two volts as compared to Vpp=15 to 17 volts with a logic supply of Vcc=five volts), the quantity of charge that it will be possible to transfer from or beneath the gate is also smaller. The programmed memory cell then has greater sensitivity to the loss of charge (leakage, duration of retention of affected data). The memory cell also gives a lower reading current. Read access is therefore slower.

Furthermore, the time for which the high voltage Vpp is applied to the cells to be programmed will have to be greater. This substantially increases the time needed for the testing of the integrated circuit, as well as the time needed to initialize the integrated circuit (when it is being configured for the user with the programming of data elements in the memory).

Finally, applying a lower logic supply voltage Vcc at the input means that the oscillation frequency of the programming high voltage generator will also be lower. We are then left, at the output of the circuit for the generation of a programming high voltage Vpp, with a higher output impedance (a lower fan-out). It is then no longer possible to apply this programming high voltage Vpp to all the cells of the memory array, a quarter array or even a page at the same time. There would be a charge (a capacitive charge) at the output that would be far too high with respect to this fan-out, which would slow down the build-up of the high voltage. It is therefore not possible to consider accessing the entire memory array in the write mode or the erasure mode or even in page mode or in quarter array write mode. All that can be envisaged is to access it in "byte" mode, namely word by word.

It will be understood that the programming time and/or erasure time is then significantly increased, directly affecting the testing time, and, hence, the final cost of the integrated circuit. Furthermore, it does not provide for greater flexibility of access to the users of the integrated circuit, since only the "byte" access mode is possible, the "total" access modes having to be prohibited.

SUMMARY OF THE INVENTION

In view of the foregoing background it is therefore an object of the invention to overcome the technical problems set forth above.

In the invention, a second logic supply pad is provided on the integrated circuit enabling the direct supply, by another external logic supply source, of the internal high voltage generation circuit. This circuit provides a specific logic supply voltage with a level higher than the level of the main logic supply voltage. This specific voltage may in practice be chosen from the permissible range of values for circuits supplied with five volts, namely between 3 to 7 volts in practice. The remainder of the circuit is supplied by the main logic supply voltage (1 to 3 volts).

An approach of this kind makes it possible to continue using all the modes of access to the memory such as the page mode (or the total memory array write mode, etc.), these being modes that can be used to save a great deal of time. This is especially advantageous in terms of test modes and customer configuration modes. Accordingly, time is saved and the cells are better programmed, i.e. with a quantity of charge beneath the gate that is sufficient to reduce the sensitivity of the cells to leakage (loss of charge).

In a numerical example, for a prior art memory supplied exclusively with two volts, the total erasure of the memory would then have to be done byte by byte, and this operation takes 24,000 ms for a memory with a 64-kilobyte capacity. With this memory, supplied, however, according to the invention with a specific logic supply of five volts for the generation of the high voltage and a main logic supply of two volts for the remainder of the integrated circuit, it is possible to carry out a total erasure of the memory. This operation then takes only 3 ms. This simple numerical example clearly shows the full value of the invention.

Furthermore, using a logic supply voltage with a higher level for the internal high voltage generation circuitry has practically no effect on the total consumption of the circuit. Indeed, in a memory circuit, the element that consumes the greatest amount of current is the internal read circuitry and, in the invention, this circuitry remains supplied by the main logic supply. The high voltage generation circuit, for its part, consumes practically nothing since the logic supply voltage is used by it in practice only to switch over transistor gates. There is thus a definite advantage here as compared with prior art approaches which, to improve the programming performance characteristics of the circuits provided with low supply voltage, make internal use of bootstrap stages which consume a great deal of current.

In practice the use of an integrated circuit with a low logic supply voltage (lower than five volts) with a specific supply for the internal high voltage generation circuitry will depend on the number of pins available on the package and the application in view. Thus, in certain cases, the specific supply pad is provided on the integrated circuit chip but when the chip is assembled in a package, this specific pad is connected to the main logic supply pin. It is then possible to apply the specific supply level, only when the chip has not yet been assembled, by means of a probe card, namely during the wafer test. Indeed, it is not possible to apply the specific supply voltage (between 3 to 7 volts) to the main supply pin, for the "low voltage" technology, especially at the level of certain inputs which would not withstand such a level.

In other cases, the pad is connected to a specific pin of the package. It is then possible to apply the specific supply voltage, not only by means of the probe card on the chip, but also by means of the specific pin after the chip has been assembled. It is then possible to use the specific voltage not only for the wafer test, but also for the final testing of the integrated circuit in the package. In this case, it is even possible to use of this specific voltage in the application, namely in the phase of customer configuration for the programming of initialization data in the memory according to the customer's specifications and in an application mode. If this specific supply level is not used in the application, the main logic supply voltage will be applied to this pin. In this case, it would be noted that the customer configuration will also be done under main logic supply voltage.

As characterized, the invention therefore relates to a memory integrated circuit comprising an internal circuit for the generation of a programming high voltage and comprising a first pad to receive a main logic supply voltage below five volts. According to the invention, the integrated circuit comprises a second specific supply pad to supply the high voltage generation circuit, enabling the application of a specific logic supply voltage with a voltage level greater than that of the main logic supply voltage.

BRIEF DESCRIPTION OF THE DRAWINGS

Other features and advantages of the invention are presented in the following description, given by way of an indication that in no way restricts the invention, with reference to the appended drawings, of which.

DETAILED DESCRIPTION OF THE PREFERRED EMBODIMENTS

Figure 1:
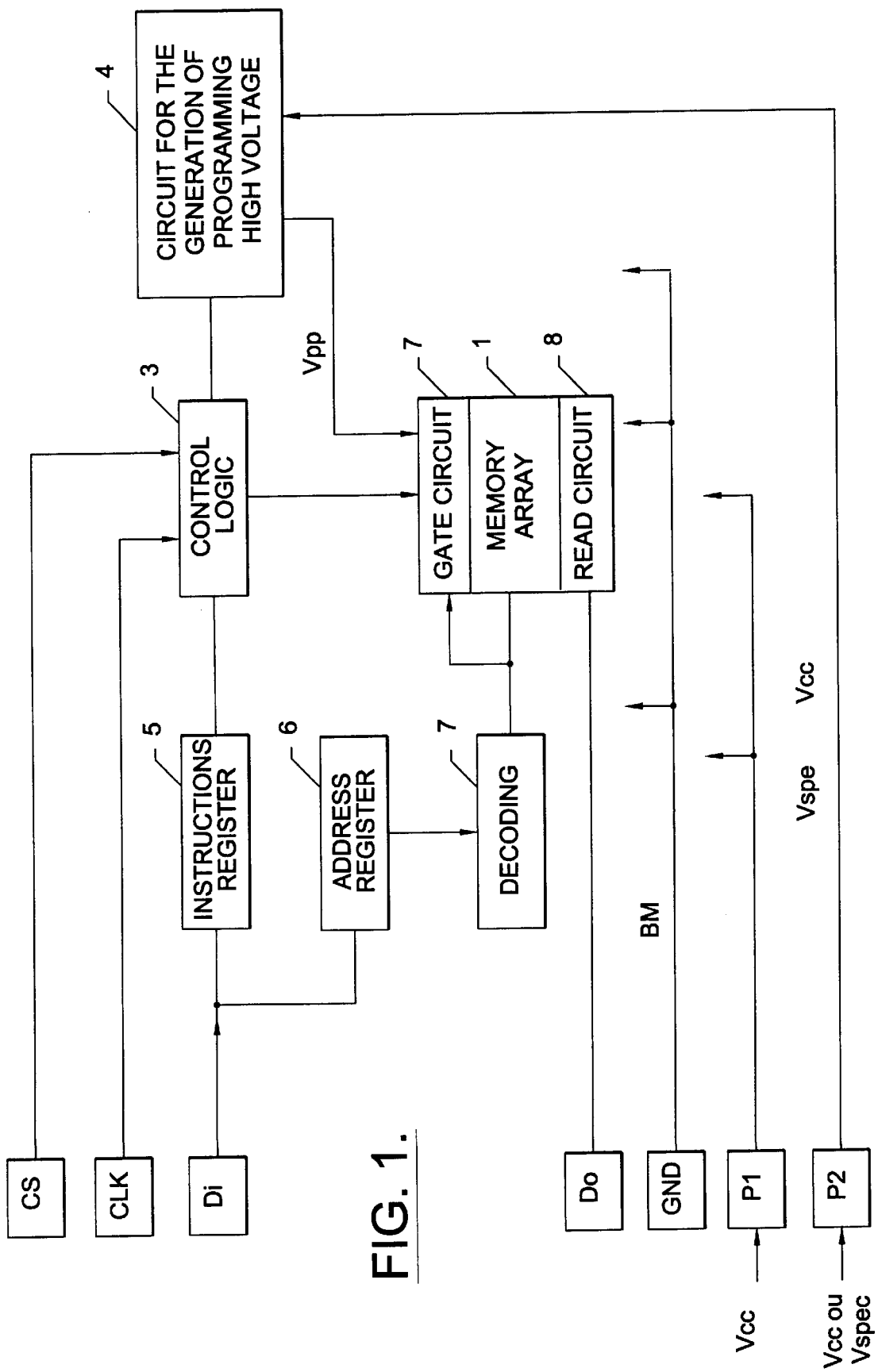
FIG. 1 is a block diagram of an integrated circuit according to the invention in an application to a serial access memory integrated circuit.

FIG. 1 shows an exemplary memory integrated circuit in which the invention has been implemented. In this example, it has been chosen to give a simplified view of a serial access type of memory. It goes without saying that the invention can be applied to any type of memory integrated circuit, whether it is a serial access or a parallel access type of memory comprising an internal circuit for the generation of programming high voltage.

Conventionally, the integrated circuit comprises a memory array 1 associated with a gate circuit 2 controlled by a control logic circuit 3 receiving, as the case may be in write mode (namely programming or erasure mode), a high voltage referenced Vpp generated by an internal high voltage generation circuit 4 (charge pump). The integrated circuit furthermore comprises input registers connected to a data input series pad Di (data in). These input registers are the instructions register 5 which activates the control logic circuit, and the address register 6 associated with the decoding circuit 7 which controls access to the memory array. Finally, a read circuit 8 comprising read amplifiers enables the transmission of the data elements read in the memory towards the data serial output pad referenced Do (data out). The integrated circuit also comprises two pads to receive a selection signal of the circuit CS and a clock signal CLK.

All these circuits must be supplied power. In the invention, these circuits are all connected to the ground bus BM which is connected to the pad GND. And, except for the high voltage generation circuit, they are all connected to the bus which conveys the main logic supply voltage Vcc. This main logic supply voltage Vcc is applied to a supply pad P1 of the integrated circuit. The programming high voltage generation circuit is for its part, according to the invention, supplied by means of a specific supply pad referenced P2. This enables it to apply a specific logic supply voltage Vspec with a level higher than the main logic supply voltage of the circuit. Thus it is possible, for example, to apply a Vspec of five volts to the supply pad P2, while the remainder of the circuit will be supplied with a Vcc of two volts applied to the supply pad P1.

Figure 2:
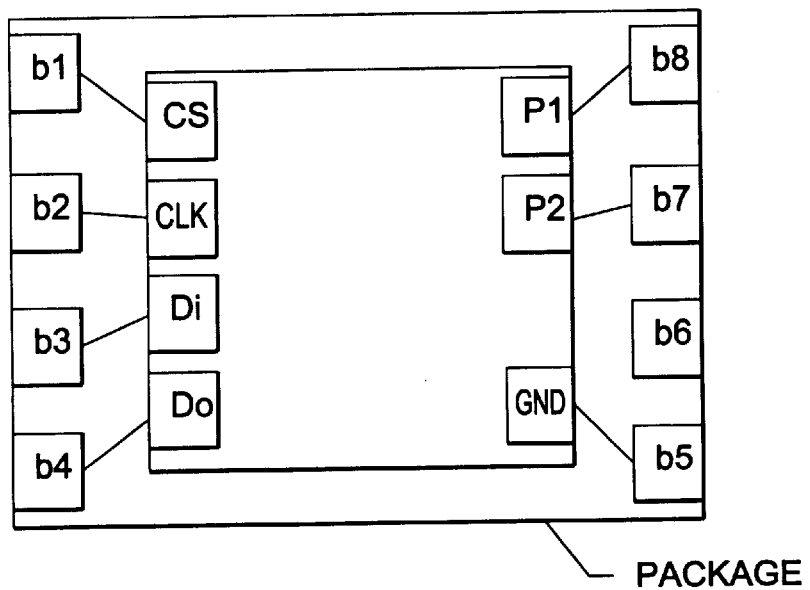
FIG. 2 shows an embodiment of the connections of the pads with the pins of the package.
Figure 3:
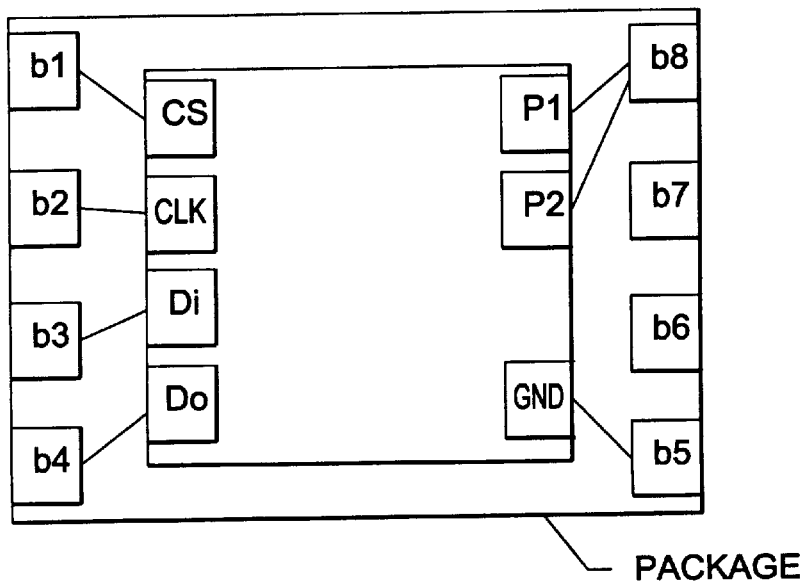
FIG. 3 shows another embodiment of these connections.

In practice, as shown in FIGS. 2 and 3, it is possible either to connect each of these supply pads P1, P2 to a different pin of the package, in the example, respectively b8, b7 (FIG. 2) or to connect these two supply pads P1, P2 of the integrated circuit to the same pin b8 of the package (FIG. 3). It must be specified here that the term "pads" is understood to mean the contact zones provided on the integrated circuit chip and that the term "pins" refers to the lugs or pins of the package in which the chip is assembled.

The first configuration shown in FIG. 2 may be the most promising one in terms of possibilities, for it enables the application of a specific logic supply voltage in all the testing phases of the circuit, as well as in the applications mode. The user of the circuit can then benefit from the best performance characteristics whether in terms of speed, flexibility of access (total modes) or reliability of the programming of the cells. However, this configuration entails the obligatory connection of the specific pin of the package to a logic voltage source. If it is intended to take advantage of these performance characteristics and total access modes in applications programs, then it would be necessary to apply the specific logic supply voltage Vpsec to the pin b7 of the package. If, in the application, there is no need either for these performance characteristics or for total access modes, this pin b7 will have to be connected to the main supply source (low voltage).

In the other configuration shown in FIG. 3, where the two supply pads P1 and P2 are connected to the same pin b8 for the main logic supply (Vcc), the principle of the invention can be used only during the wafer test before the chip is mounted in the package. Once the chip is mounted in the package, the entire integrated circuit without exception is supplied by the main logic supply voltage.

The invention can be applied to all memory integrated circuits comprising a high voltage generation circuit and supplied with low logic voltage below five volts. It makes it possible to reduce the time dedicated to the testing of the integrated circuit. In certain cases (FIG. 2), it enables an improvement in the performance characteristics (speed, reliability of programming) of the integrated circuit in its application.

What is claimed is:

1. A memory integrated circuit comprising:
   a memory array;
   an internal programming circuit for generating a programming high voltage for the memory array;
   a first pad, connected to the memory array, for receiving a main logic supply voltage;
   a second specific supply pad to supply said internal programming circuit with a specific logic supply voltage greater than the main logic supply voltage; and a third pad, connected to the memory array, for receiving a ground voltage.

2. A memory integrated circuit according to claim 1, wherein the first pad is for receiving a main logic supply voltage of less than about 5 volts.

3. A memory integrated circuit according to claim 1, further comprising a package including a plurality of external pins.

4. A memory integrated circuit according to claim 3, and wherein the first pad and the second pad are each connected to a different external pin of the package.

5. A memory integrated circuit according to claim 3, wherein both the first pad and the second pad are connected to a common pin of the package.

6. A memory integrated circuit according to claim 1, further comprising:
   control logic; and
   a gate circuit controlled by said control logic and receiving the programming high voltage.

7. A memory integrated circuit according to claim 6, further comprising an address register and decoding circuit connected to said memory array and said gate circuit.

8. A memory integrated circuit according to claim 6, further comprising an instructions register connected to said control logic.

9. A memory integrated circuit according to claim 1, further comprising a read circuit connected to said memory array.

10. An integrated circuit comprising:
    a memory array;
    an internal programming circuit for generating a programming high voltage for the memory array;
    a first pad, connected to the memory array, for receiving a main logic supply voltage;
    a second specific supply pad to supply said internal programming circuit with a specific logic supply voltage greater than the main logic supply voltage;
    a third pad, connected to the memory array, for receiving a ground voltage; and
    a package including a plurality of external pins, different external pins being connected to said first and second pads.

11. An integrated circuit according to claim 10 wherein the first pad is for receiving a main logic supply voltage of less than about 5 volts.

12. An integrated circuit according to claim 10, further comprising:
    control logic; and
    a gate circuit controlled by said control logic and receiving the programming high voltage.

13. An integrated circuit according to claim 12, further comprising an address register and decoding circuit connected to said memory array and said gate circuit.

14. An integrated circuit according to claim 12, further comprising an instructions register connected to said control logic.

15. An integrated circuit according to claim 10, further comprising a read circuit connected to said memory array.

16. An integrated circuit comprising:
    a memory array;
    an internal programming circuit for generating a programming high voltage for the memory array;
    a first pad for receiving a main logic supply voltage;
    a second specific supply pad to supply said internal programming circuit with a specific logic supply voltage greater than the main logic supply voltage; and
    a package including a plurality of external pins, a common external pin being connected to both said first and second pads.

17. An integrated circuit according to claim 16, wherein the first pad is for receiving a main logic supply voltage of less than about 5 volts.

18. An integrated circuit according to claim 16, further comprising:
    control logic; and
    a gate circuit controlled by said control logic and receiving the programming high voltage.

19. An integrated circuit according to claim 18, further comprising an address register and decoding circuit connected to said memory array and said gate circuit.

20. An integrated circuit according to claim 18, further comprising an instructions register connected to said control logic.

21. An integrated circuit according to claim 16, further comprising a read circuit connected to said memory array.

22. A method for making an integrated circuit comprising the steps of:
    forming a memory array;
    forming internal programming circuit for generating a programming high voltage for the memory array;
    forming a first pad, connected to the memory array, for receiving a main logic supply voltage;
    forming a second specific supply pad to supply said internal programming circuit with a specific logic supply voltage greater than the main logic supply voltage; and
    forming a third pad, connected to the memory array, for receiving a ground voltage.

23. A method according to claim 22, further comprising the step of forming a package including a plurality of external pins.

24. A memory according to claim 23, further comprising the step of connecting the first pad and the second pad to different external pins of the package.

25. A method according to claim 23, further comprising the step of connecting both the first pad and the second pad to a common pin of the package.

26. A memory integrated circuit comprising:
    a memory array;
    an internal programming circuit for generating a programming high voltage for the memory array;
    a first pad, connected to the memory array, for receiving a main logic supply voltage;
    a second specific supply pad to supply said internal programming circuit with a specific logic supply voltage greater than the main logic supply voltage;
    control logic;
    an instructions register connected to said control logic; and
    a gate circuit, connected to the memory array, controlled by said control logic and receiving the programming high voltage.

27. A memory integrated circuit according to claim 26, wherein the first pad is for receiving a main logic supply voltage of less than about 5 volts.

28. A memory integrated circuit according to claim 26, further comprising a package including a plurality of external pins.

29. A memory integrated circuit according to claim 28, and wherein the first pad and the second pad are each connected to a different external pin of the package.

30. A memory integrated circuit according to claim 28, wherein both the first pad and the second pad are connected to a common pin of the package.

31. A memory integrated circuit according to claim 26, further comprising an address register and decoding circuit connected to said memory array and said gate circuit.

32. A memory integrated circuit according to claim 26, further comprising a read circuit connected to said memory array.

33. An integrated circuit comprising:
   a memory array;
   an internal programming circuit for generating a programming high voltage for the memory array;
   a first pad, connected to the memory array, for receiving a main logic supply voltage;
   a second specific supply pad to supply said internal programming circuit with a specific logic supply voltage greater than the main logic supply voltage;
   control logic;
   a gate circuit, connected to the memory array, controlled by said control logic and receiving the programming high voltage;
   an instructions register connected to said control logic; and
   a package including a plurality of external pins, different external pins being connected to said first and second pads.

34. An integrated circuit according to claim 33 wherein the first pad is for receiving a main logic supply voltage of less than about 5 volts.

35. An integrated circuit according to claim 33, further comprising an address register and decoding circuit connected to said memory array and said gate circuit.

36. An integrated circuit according to claim 33, further comprising a read circuit connected to said memory array.

37. A method for making an integrated circuit comprising the steps of:
   forming a memory array;
   forming internal programming circuit for generating a programming high voltage for the memory array;
   forming a first pad, connected to the memory array, for receiving a main logic supply voltage;
   forming a second specific supply pad to supply said internal programming circuit with a specific logic supply voltage greater than the main logic supply voltage;
   forming a package including a plurality of external pins; and
   connecting both the first pad and the second pad to a common pin of the package.

38. A memory according to claim 37, further comprising the step of connecting the first pad and the second pad to different external pins of the package.

* * * * *